United States Patent
Wang et al.

(10) Patent No.: US 7,407,565 B2
(45) Date of Patent: Aug. 5, 2008

(54) METHOD AND APPARATUS FOR IONIZED PLASMA DEPOSITION

(75) Inventors: Wei Wang, Cupertino, CA (US); James Van Gogh, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 162 days.

(21) Appl. No.: 10/646,405

(22) Filed: Aug. 22, 2003

(65) Prior Publication Data

US 2004/0031677 A1 Feb. 19, 2004

Related U.S. Application Data

(62) Division of application No. 09/505,263, filed on Feb. 16, 2000, now Pat. No. 6,627,056.

(51) Int. Cl.
*C23C 14/35* (2006.01)
(52) U.S. Cl. .................. 204/192.12; 204/192.17; 204/192.22; 204/298.07; 204/298.11; 204/298.06
(58) Field of Classification Search ............ 204/192.12, 204/192.17, 192.22, 298.07, 298.11, 298.06, 204/298.12, 298.08
See application file for complete search history.

(56) References Cited

U.S. PATENT DOCUMENTS

| 4,392,931 | A | * | 7/1983 | Maniv et al. | 204/192.12 |
|---|---|---|---|---|---|
| 4,425,218 | A | | 1/1984 | Robinson | 204/298 |
| 4,810,342 | A | | 3/1989 | Inoue | 204/192.17 |
| 5,108,569 | A | * | 4/1992 | Gilboa et al. | 204/192.13 |
| 5,108,570 | A | | 4/1992 | Wang | 204/192.3 |
| 5,131,460 | A | | 7/1992 | Krueger | 165/80.2 |
| 5,322,605 | A | | 6/1994 | Yamanishi | 204/298.07 |
| 5,340,459 | A | * | 8/1994 | Takehara | 204/298.07 |
| 5,427,670 | A | | 6/1995 | Baggerman et al. | 204/298.09 |

(Continued)

FOREIGN PATENT DOCUMENTS

EP 0 758 148 A2 * 2/1997

(Continued)

OTHER PUBLICATIONS

Machine Translation of 10-324969 and 06-041733.*

(Continued)

*Primary Examiner*—Rodney G McDonald
(74) *Attorney, Agent, or Firm*—Patterson Sheridan, LLP

(57) ABSTRACT

A system for performing PVD of metallic nitride(s) is disclosed. The improved performance is provided by a method of increasing the partial pressures of nitrogen or other active gases near the wafer surface through initial introduction of the argon or other neutral gases alone into an ionized metal plasma PVD chamber through an upper gas inlet at or near the target, initiating the plasma in the presence of argon or other neutral gases alone, after which nitrogen or other active gases are introduced into the chamber through a lower gas inlet at or near the wafer surface to increase deposition rates and lower electrical resistivity of the deposited metallic layer. An apparatus for carrying out the invention includes a source of argon near the target surface and a source of nitrogen integral to the substrate support thereby delivering nitrogen near the substrate surface.

28 Claims, 4 Drawing Sheets

U.S. PATENT DOCUMENTS

| | | | | |
|---|---|---|---|---|
| 5,643,422 A | | 7/1997 | Yamada | 204/192.15 |
| 5,658,442 A | | 8/1997 | Van Gogh et al. | 204/298.12 |
| 5,810,933 A | | 9/1998 | Mountsier et al. | 118/724 |
| 5,830,330 A | * | 11/1998 | Lantsman | 204/192.12 |
| 5,876,574 A | | 3/1999 | Hofmann et al. | 204/192.13 |
| 5,882,417 A | | 3/1999 | Van de Ven et al. | 118/728 |
| 5,925,225 A | | 7/1999 | Ngan et al. | 204/192.17 |
| 5,968,327 A | | 10/1999 | Kobayashi et al. | 204/298.11 |
| 6,203,674 B1 | * | 3/2001 | Yamaguchi | 204/192.22 |
| 6,451,184 B1 | * | 9/2002 | Sone | 204/298.11 |

FOREIGN PATENT DOCUMENTS

| | | | | |
|---|---|---|---|---|
| EP | 840351 | * | 5/1998 | |
| EP | 0 860 514 | | 8/1998 | |
| EP | 0 861 920 | | 9/1998 | |
| JP | 63-297556 | | 12/1988 | 204/298.07 |
| JP | 1-119664 | | 5/1989 | 204/298.07 |
| JP | 06-041733 | * | 2/1994 | |
| JP | 6-41733 | | 2/1994 | 204/298.07 |
| JP | 10-324969 | * | 12/1998 | |

OTHER PUBLICATIONS

Search Report for PCT/US01/05140, dated Jun. 25, 2001.

* cited by examiner

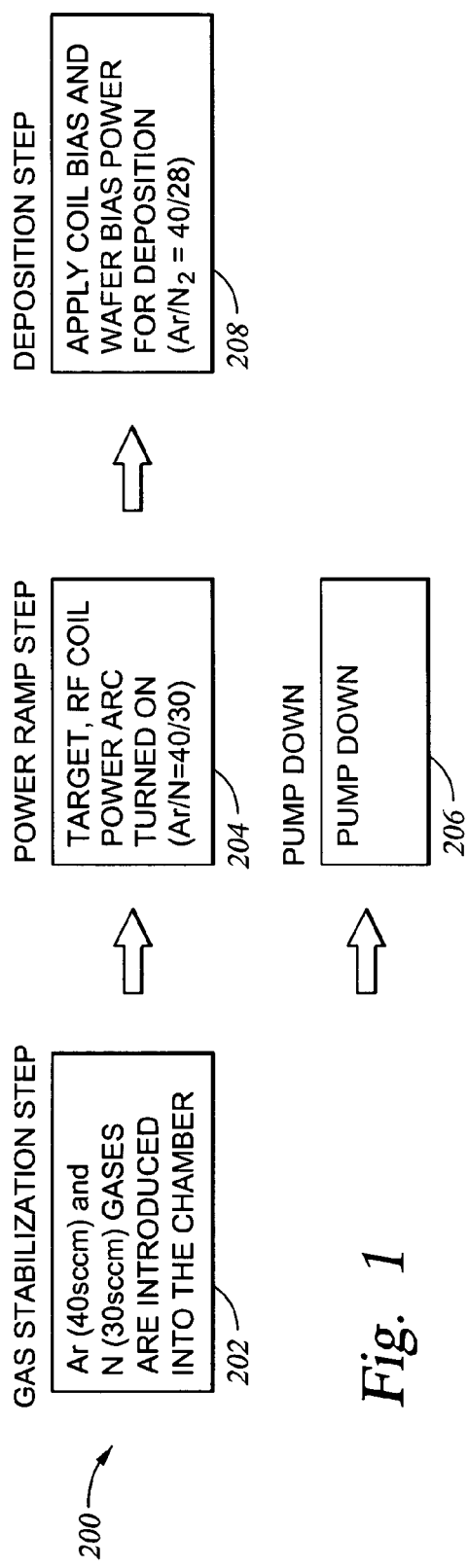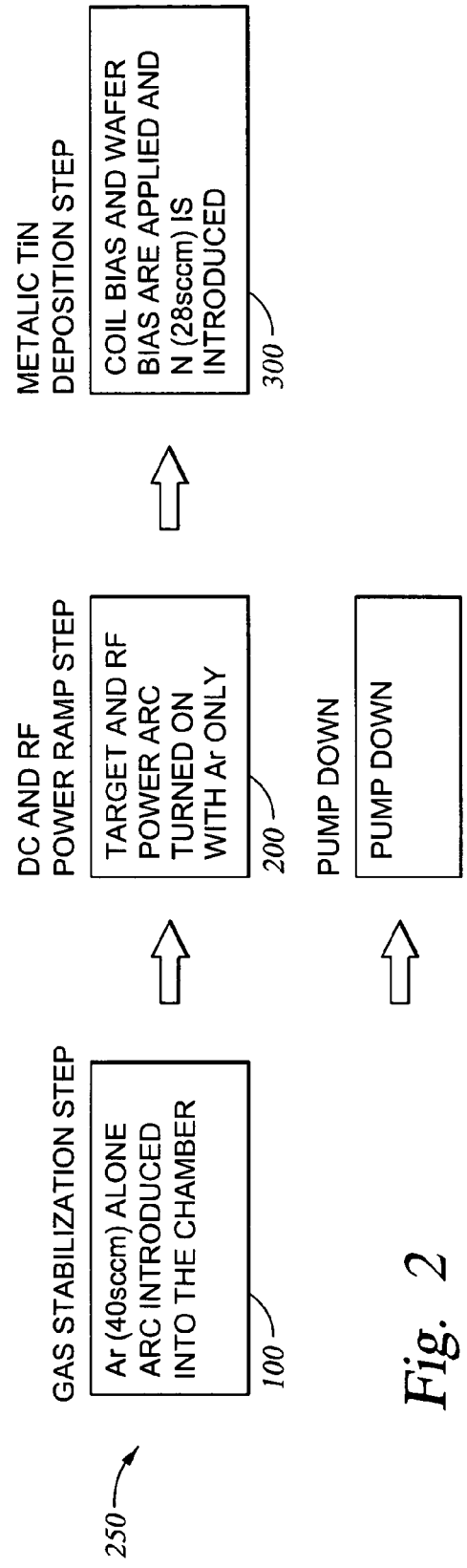

METHOD AND APPARATUS FOR IONIZED PLASMA DEPOSITION

CROSS-REFERENCE TO RELATED APPLICATIONS

This application is a divisional of U.S. patent application Ser. No. 09/505,263, filed Feb. 16, 2000, issued Sep. 30, 2003, now U.S. Pat. No. 6,627,056, which is herein incorporated by reference.

BACKGROUND OF THE INVENTION

1. Field of the Invention

The present invention relates to integrated circuit structures. More particularly, the invention relates to a method and apparatus for depositing metallic nitride layers on a substrate using a Physical Vapor Deposition (PVD) system and technique.

2. Description of the Related Art

In the formation of integrated circuit structures, an insulating layer is formed over active devices, or over a patterned underlying metal interconnect layer, and vertical openings are then formed through this insulating layer to provide electrical communication from the upper surface of the insulating layer to the underlying active device or electrical interconnect. Such openings are then filled with an electrically conductive material to provide electrical connection between the underlying elements and conductive materials, such as a metal interconnect, subsequently formed on the surface of the insulating material. In the fabrication of both horizontal and vertical interconnects, barrier layers are typically deposited over the patterned surface of a substrate to provide a barrier to prevent diffusion between adjacent materials. Conventional barrier layers include materials such as titanium nitride (TiN), tantalum nitride and tungsten nitride. The materials have been conventionally deposited using physical vapor deposition (PVD). TiN layers, in particular, have been used between adjacent materials as barrier layers for preventing the interdiffusion of adjacent layers of materials such as silicone dioxide and aluminum, for example. The barrier layer acts to limit the diffusion between the conductive and non-conductive materials and increases the reliability of the interconnect.

A conventional physical vapor deposition (PVD) processing chamber is typically operated at a pressure of about 1-10 millitorr using an inert gas such as argon (or a mixture of gases). A target of the material to be deposited (or sputtered) such as titanium is disposed in the chamber and connected to a source of DC and/or RF power. The substrate being processed is mounted on a support member spaced from and generally parallel to the target. A glow discharge plasma is struck in the processing gas by the application of DC (or RF) power to the target, and the positive argon ions are attracted to the negatively charged target. Atoms of the target material are knocked loose or sputtered from the target due to the impact momentum of the impinging argon ions and their interaction with the target material structure or lattice. The particles of material sputtered from the target are generally neutral atoms or molecules. These particles are directed in a plurality of angles from the target surface, following a distribution of directions which varies as the cosine of the angle from the particle trajectory to an angle normal to the target surface. Consequently a limited number of atoms are sputtered from the target and travel directly vertically or normal to the surface of a substrate on which they are to be deposited.

An improved PVD deposition apparatus and process enhanced by higher-pressure background gas and an RF (radio frequency) coil, known as an ionized metal plasma (IMP) chamber and process. The IMP process provides ionization of the neutral sputtered metallic particles between the target and the substrate by utilizing background gas at pressures in the range of about 10 to about 40 millitorr in the processing chamber. A helical coil is mounted inside the chamber between the target and the substrate support and is connected to a source of RF power. The axis of the RF coil is placed generally perpendicular to the target surface and the substrate surface. If the pressure in the chamber is, for example, about 30-40 millitorr, the internal inductively coupled coil provides a high density plasma in the region between the target and the substrate support. Sputtered target atoms become ionized and positively charged as they pass through the high density plasma region. The metal ions are attracted by the negatively biased substrate and thus travel toward the substrate in a more vertical direction than occurs in conventional PVD chambers.

With the decreasing sizes of features and increased aspect ratios, barrier materials, such as TiN, are being deposited on a substrate using an IMP Physical Vapor Deposition system having a target and RF coil made of titanium. To achieve TiN deposition, both Argon (Ar) and Nitrogen are typically introduced simultaneously into a conventional IMP chamber at or near the substrate in the bottom of the chamber. After introducing both Ar and Nitrogen into the IMP chamber, power is provided to the target and the RF coil. Thereafter, a wafer bias is provided to promote deposition of the TiN on the substrate surface.

FIG. 1, is a flow diagram illustrating a conventional titanium nitride process 200. The process 200 typically begins with a gas stabilization step 202 which comprises the simultaneous introduction of about 40 sccm Ar and about 30 sccm nitrogen gas through gas inlets at or near the bottom of the chamber. Next, a power ramp step 204 is performed where power is applied to the target and the RF coil to generate a plasma. Concurrent with the power ramp step, a pump down step 206 is performed to maintain a pressure of, for example, about 20 mTorr in the chamber. After the plasma is generated, a deposition step 208 is performed by applying a wafer bias. During this step, the concentrations of Ar and Nitrogen are tuned to about 40 and 28 sccm, respectively.

The reactive sputtering techniques described above typically result in titanium nitride build-up on the sputtered surface of the titanium target over time causing the deposition rate of titanium nitride to decrease to about one third of the typical sputtering rate. This results because titanium nitride has a lower sputtering yield than titanium. Additionally, the nitrided target results in a TiN barrier layer formed on the substrate surface which has a higher electrical resistivity. The introduction of the two gases also provides unnecessarily high partial pressures of nitrogen near the target surface resulting in nitriding of the target.

It would be valuable to provide an improved PVD apparatus and process which could significantly improve the deposition rate of a nitrided material on a substrate surface by decreasing the likelihood that the target would be nitrided in the sputtering process.

SUMMARY OF THE INVENTION

In one aspect, the present invention is directed to a plasma enhanced physical vapor deposition system, comprising: a vacuum chamber housing having a sputtering target, a substrate support member spaced apart from the target, a first gas inlet port in the vacuum chamber housing proximate the sputtering target and a second gas inlet port in the vacuum chamber housing proximate the substrate support member. The first gas may be an inert gas such as argon.

In another aspect, the present invention is directed to a method of enhancing the deposition of metallic layers on a substrate within a vacuum chamber having a sputtering target and substrate support member therein, comprising substantially evacuating the vacuum chamber; in a gas stabilization step, introducing a first gas at a predetermined pressure into the vacuum chamber proximate a sputtering target; following the gas stabilization steps, in a power ramp step, initiating a plasma within the chamber, and following the power ramp step, in a metallic deposition step, introducing a second gas into the chamber with the plasma already initiated and applying a coil, wafer and target bias to initiate sputtering. The first gas may be argon, the second gas may be nitrogen, and the sputtering target may be titanium. Still further, the power ramp step may include initiating the plasma by applying target power and RF power in the presence of only argon and the metallic deposition step may introduce nitrogen after the plasma has been initiated.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIG. 1 is a flow diagram of a conventional IMP-Ti process.

FIG. 2 is a flow diagram of an improved IMP-Ti system according to the present invention.

DETAILED DESCRIPTION OF THE PREFERRED EMBODIMENT

The invention will be described below with reference to an IMP deposition chamber and process. However, it is to be understood that other chambers, coil materials, target materials, and deposition processes can benefit from the invention as well. For example, TaN, WN, and other nitride deposition processes may benefit from the invention as well.

Figure 3:
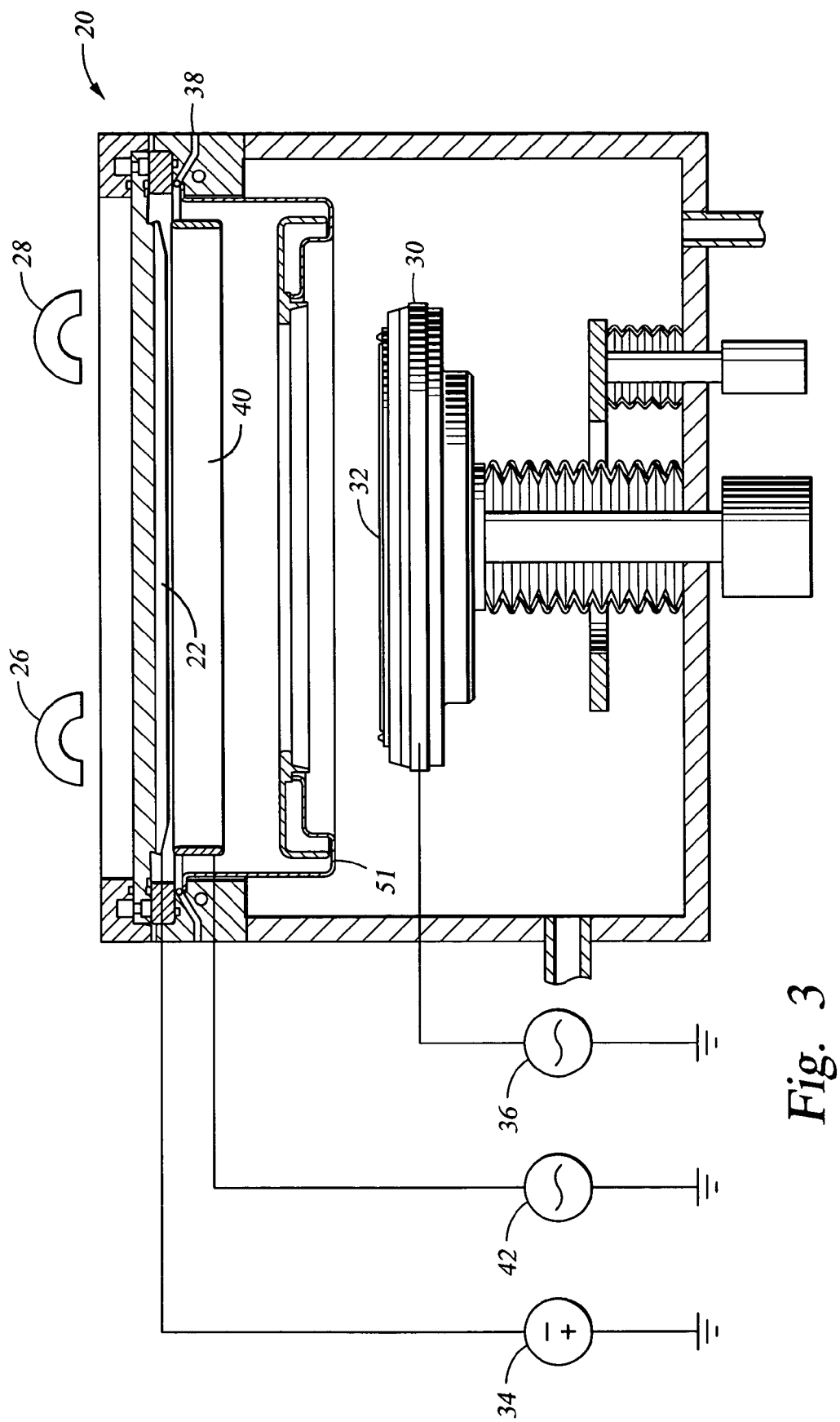
FIG. 3 is a schematic, cross sectional view of an IMP chamber and system according to the present invention.

FIG. 3 is a cross sectional view of an IMP chamber 20 in accordance with the present invention. The chamber 20 has a conventional Ti sputtering target 22 mounted on the lid of chamber 20. A magnetron having at least a pair of opposing magnets 26, 28 may be disposed on the lid of the chamber 20 and can be rotated by a rotational device (not shown). A substrate support 30 has a substrate 32 disposed on its upper surface and is preferably placed parallel to and opposite the target 22. A coil 40 is disposed between the target 22 and the substrate support 30. The coil is a single turn RF coil made of titanium (Ti). A DC power source 34 is connected to the target 22. An RF power source 36 is connected to the substrate support 30. These two power sources provide the proper polarity bias (negative) to the target 22 and to the substrate support 30 and hence to the substrate. An RF power supply 42 is connected to the RF coil 40. Provided that the background gas pressure is maintained at about 30 millitorr, the RF coil 40, when excited by the RF power supply 42 under control of the computer (not shown) operates to provide a high to medium density plasma in the interior region of the coil during the IMP process.

Figure 4:
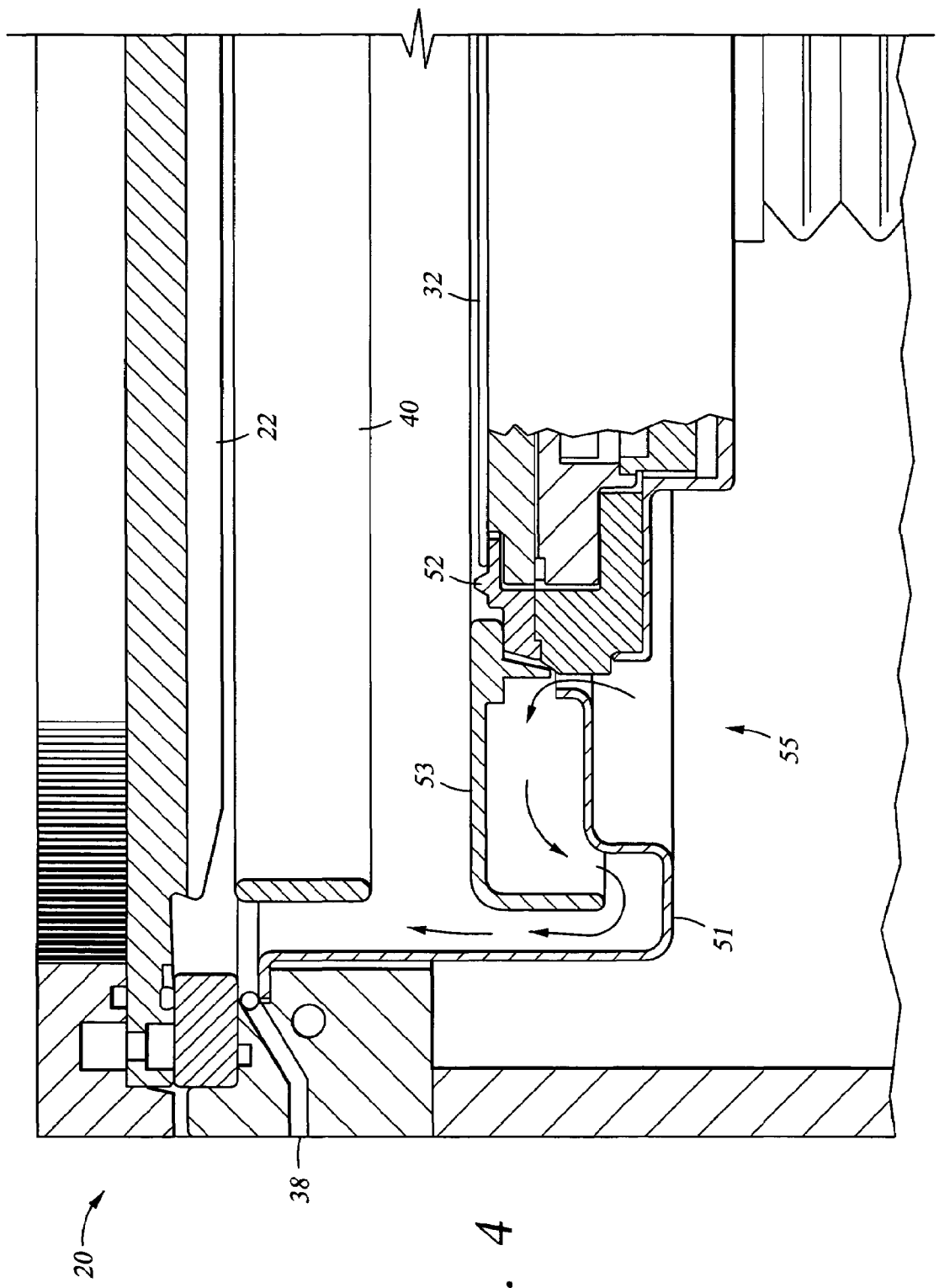
FIG. 4 is another view of the chamber of FIG. 3.

Upper gas inlet 38 supplies a background gas, or inert gas flow (such as argon or other inert gas or gas mixture) into the chamber 20 at or near the target 22. Lower gas inlet 39 supplies an active gas flow, such as nitrogen, into the chamber 20 at or near the wafer surface to provide higher partial pressures of the active gas at or near the wafer surface. In this embodiment, as illustrated in FIG. 4, the nitrogen reaches the wafer surface by migrating through a gap formed between the ring 53 and the support 51. The flow of gas is shown by the arrows therein.

Figure 5:
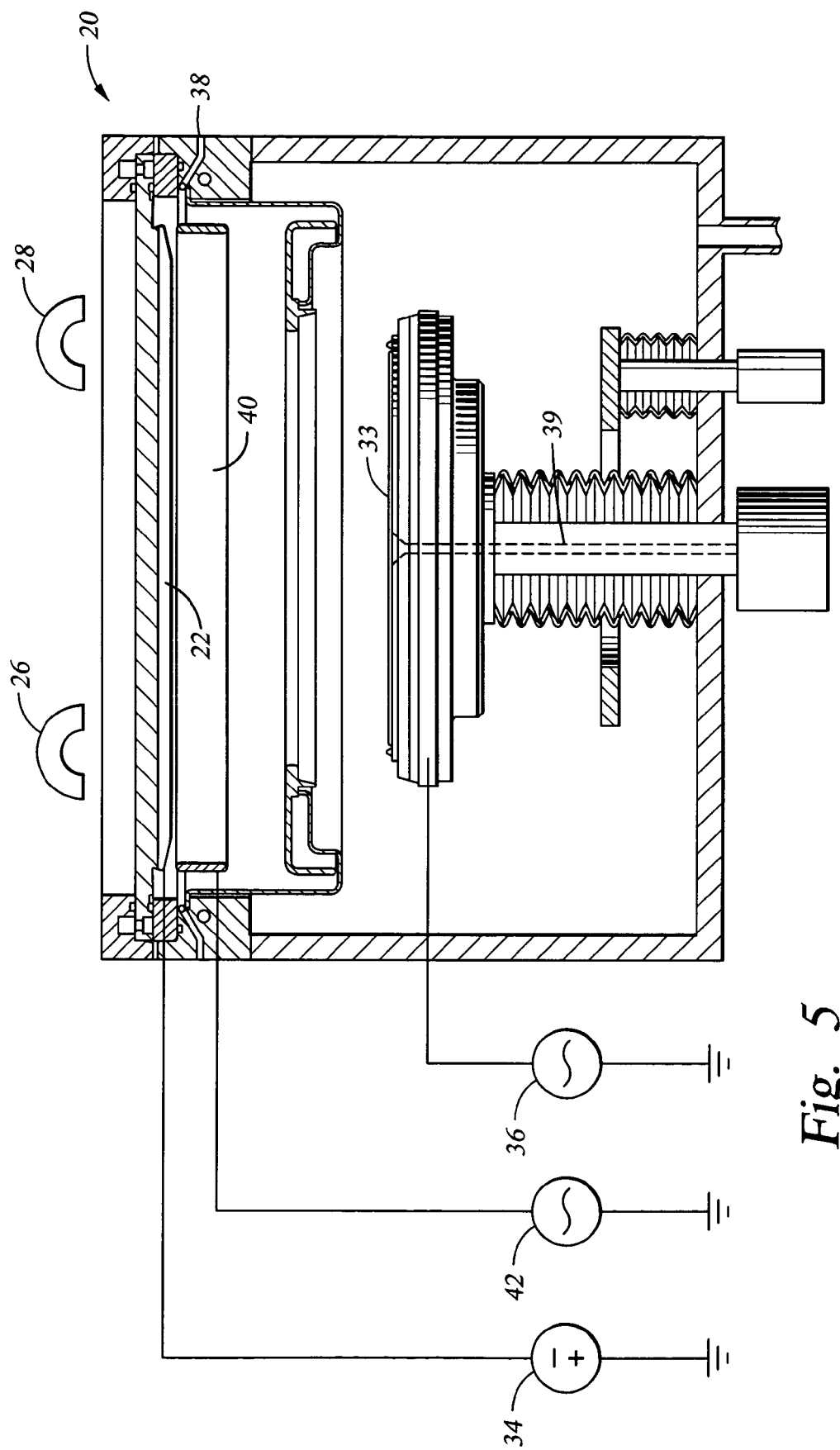
FIG. 5 is a schematic, cross sectional view of an IMP chamber and system according to another embodiment of the present invention.

In an alternative embodiment shown in FIG. 5, gas inlet 39 is integrally formed in the substrate support 30. Gas sources may be connected to the upper and lower gas inlets 38, 39 via flow lines and valves (not shown) which are adjustable and are controlled by a control computer (not shown). The control computer can be any general purpose digital computer having a central processing unit, memory and being programmed to operate the gas valves, the vacuum pumping system and vacuum pump valve, the RF power supply 36, the DC power supply 34 and the plasma generator RF power supply 42. The control computer may also control a closed loop coolant pumping system which circulates an appropriate coolant, such as deionized water, through the substrate support or other chamber component requiring thermal control. The control computer executes a machine readable program product stored in a memory in order to perform the steps of the invention.

In a TiN deposition process according to the present invention, a metallic TiN layer is deposited on the surface of the wafer 32 by creating a high partial pressure of N near the wafer surface and by creating a high partial pressure of Ar at or near the target 22. This minimizes nitrogen concentrations at or near the target 22, thus minimizing any nitriding of the target 22. To accomplish this, the Ar gas is introduced through gas inlet 38 located near the target 22 and the N gas is introduced using a lower gas inlet 39 located at or near the wafer surface 32 or otherwise located near the bottom of the IMP-Ti chamber 20. Additionally, the Ar can also be introduced first and the plasma struck prior to flowing nitrogen in to the chamber.

Referring to FIG. 2, the improved IMP-Ti process 250 according to the present invention is carried out as follows. In a gas stabilization step 100, Ar in the range of 35-45 sccm is introduced into the IMP-Ti chamber 20 using upper gas inlet 38 prior to the introduction of N. The gas stabilization step 100 may take approximately 15 seconds. Following the gas stabilization step 100, a DC and RF power ramp step 200 is carried out during which the target 22 and RF power is turned on in the presence of Ar. The DC and RF power ramp step 200 initiates the plasma within the IMP-Ti chamber 20 and may take approximately 4 seconds. Following the DC and RF power ramp step 200, a metallic TiN deposition step 300 is carried out during which N in the range of 25-35 sccm is introduced into the IMP-Ti chamber 20 using the lower gas inlet 39 with the plasma already activated and the coil and wafer bias applied for deposition of TiN on the wafer surface 32. This sequence is shown in the diagram of FIG. 2.

Metallic TiN films deposited according to the present invention result in a higher deposition rate and a lower electrical resistivity compared to the TiN films deposited according to conventional deposition processes. For example, a typical metallic nitride deposition step 300 according to the present invention may require only 40 seconds whereas a conventional deposition step may require 61 seconds. Furthermore, Table 1 below shows a comparison of properties of TiN deposited according to the present invention with a non-nitrided target and TiN deposited according to conventional processes with at least a partially nitrided target.

TABLE 1

| | Target Voltage | Coil Voltage | Dep. rate (X/min) | Resistivity (: ohm cm) | $R_s$ Uniformity | B.C. |
|---|---|---|---|---|---|---|
| Prior Art Nitrided target | 290 | 280 | 230 | 110 | 5.5 | .4 |
| Non-nitrided target of the Present Invention | 190 | 185 | 600 | 40 | 5.4 | .35 |

Table 1 shows the properties achieved by the continuous processing of approximately 170 wafers using a non-nitrided target according to the present invention along with those properties achieved through conventional deposition processes. 3.5 kW DC, 2 kW RF, and 1.5 kW $DC_{coil}$ were used in each case shown above in Table 1. As can be seen, $R_s$ uniformity is roughly the same between conventional deposition processes and processes according to the present invention. However, notable resistivity reductions were achieved using the non-nitrided target process of the invention. While significantly reducing the TiN film resistivity, the non-nitriding deposition process according to the present invention also achieves dramatic increases in deposition rate from about 230 Å/min using the conventional deposition processes to about 600 Å/min using the improved deposition process and apparatus. At the same time, coil voltage was reduced from about 280V to about 185V and target voltage was reduced from about 290V to about 190V.

It should be noted that while the embodiments described in detail contemplate a titanium (Ti) coil and target for use in an IMP-TiN PVD deposition process, other metallic PVD deposition systems could offer improved in-film defect deposition properties if designed and operated according to the concepts of the invention. For example, the PVD deposition tantalum, using a Ta coil/target or tungsten, using a W coil/target also fall within the spirit and scope of the invention. Additionally, target power, chamber pressure and volume, and pumping speeds are all variables and those skilled in the art will appreciate that depending upon hardware utilized, these variables can change in practice.

While foregoing is directed to the preferred embodiment of the present invention, other and further embodiments of the invention may be devised without departing from the basic scope thereof, and the scope thereof is determined by the claims that follow.

What is claimed is:

1. A method of depositing metallic film layers on a substrate, comprising:
   introducing a first gas into a vacuum chamber wherein the first gas is introduced through an first inlet port disposed proximate a sputtering target disposed inside the vacuum chamber, wherein the sputtering target is made of a material selected from a group consisting of titanium, tantalum and tungsten;
   applying power to the sputtering target and a coil disposed between the sputtering target and the substrate positioned on a substrate support member in the presence of only the first gas; and
   introducing a second gas into the chamber to deposit the metal containing film layers, wherein the second gas is introduced from a bottom portion of the vacuum chamber proximate a surface of the substrate in the presence of the power applied to the sputter target and the coil, wherein the second gas from the bottom portion of the vacuum chamber is supplied through a gap defined between a shield ring and a shield support member to the substrate surface.

2. The method of claim 1, further comprising biasing the substrate and the coil.

3. The method of claim 1, wherein the second gas is introduced proximate an upper surface of the substrate.

4. The method of claim 1, wherein the power is applied to the sputtering target and the coil to initiate plasma.

5. The method of claim 1, wherein the first gas is introduced to encourage gas stabilization.

6. The method of claim 1, wherein the power is applied to the sputtering target and the coil following a controlled power ramp process.

7. The method of claim 1, wherein the first gas is argon.

8. The method of claim 1, wherein the second gas is nitrogen.

9. The method of claim 1, wherein the first gas is inert.

10. The method of claim 1, wherein the second gas is active.

11. The method of claim 1, wherein the second gas is introduced after the power is applied to the sputtering target and the coil.

12. The method of claim 1, wherein the coil is made of a material selected from a group consisting of titanium, tantalum and tungsten.

13. The method of claim 1, wherein introducing the first gas into the vacuum chamber wherein the first gas is introduced proximate the sputtering target comprises creating a higher partial pressure of the first gas proximate the sputtering target than at the upper surface of the substrate.

14. The method of claim 1, wherein introducing the second gas into the chamber wherein the second gas is introduced proximate the upper surface of the substrate comprises creating a higher partial pressure of the second gas proximate the upper surface of the substrate than at the sputtering target.

15. The method of claim 1, wherein the shield ring, the shield support member and the substrate support member are disposed inside the vacuum chamber.

16. A method of depositing metallic film layers on a substrate, comprising:
   creating a higher partial pressure of an inert gas inside a vacuum chamber through a first inlet port disposed proximate a sputtering target disposed therein than at an upper surface of the substrate positioned on a substrate support member disposed in the vacuum chamber;
   initiating a plasma within the chamber by applying a power to the sputter target and a coil disposed between the sputtering target and the substrate; and
   creating a higher partial pressure of an active gas introduced through a bottom portion of the vacuum chamber proximate the upper surface of the substrate than at the sputtering target to deposit the metal containing film layers in the presence of the power applied to the sputter target and the coil, wherein the active gas from the bottom portion of the vacuum chamber is supplied through a gap defined between a shield ring and a shield support member to the substrate surface.

17. The method of claim 16, further comprising biasing a coil and the substrate, wherein the coil is disposed between the sputtering target and the substrate.

18. The method of claim 17, wherein the coil is made of a material selected from a group consisting of titanium, tantalum and tungsten.

19. The method of claim 17, wherein initiating the plasma comprises applying power to the sputtering target and the coil in the presence of only the inert gas.

20. The method of claim 16, wherein the inert gas is argon and the active gas is nitrogen.

21. The method of claim 16, wherein the sputtering target is made of a material selected from a group consisting of titanium, tantalum and tungsten.

22. The method of claim 16, wherein the shield ring, the shield support member and the substrate support member are disposed inside the vacuum chamber.

23. A method of depositing metallic film layers on a substrate comprising:
    creating a higher partial pressure of argon inside a vacuum chamber through a first inlet port disposed proximate a sputtering target disposed therein than at an upper surface of the substrate positioned on a substrate support member disposed in the vacuum chamber, wherein the sputtering target is made of a material selected from a group consisting of titanium, tantalum and tungsten;
    applying power to the sputtering target and a coil disposed between the sputtering target and the substrate, wherein the coil is made of a material selected from a group consisting of titanium, tantalum and tungsten;
    creating a higher partial pressure of nitrogen through a bottom portion of the vacuum chamber proximate the upper surface of the substrate than at the sputtering target to deposit the metal containing film layers in the presence of the power applied to the sputter target and the coil, wherein the nitrogen from the bottom portion of the vacuum chamber is supplied through an annular gap defined between a shield ring and a shield support member to the substrate surface; and
    biasing the coil and the substrate.

24. A method of depositing metallic film layers on a substrate, comprising:
    introducing a gas mixture into a vacuum chamber through a first inlet port disposed proximate a sputtering target disposed inside the vacuum chamber;
    creating a higher partial pressure of an inert gas inside the vacuum chamber proximate the sputtering target disposed therein than at an upper surface of the substrate positioned on a substrate support member;
    applying power to the sputtering target and a coil disposed between the sputtering target and the substrate; and
    introducing a second gas into the chamber through a bottom portion of the vacuum chamber proximate the upper surface of the substrate to deposit the metal containing film layers in the presence of the power applied to the sputter target and the coil, wherein the second gas from the bottom portion of the vacuum chamber is supplied through an annular gap defined between a shield ring and a shield support member to the substrate surface.

25. The method of claim 24, wherein the gas mixture comprises argon and nitrogen, and the second gas comprises nitrogen.

26. The method of claim 24, further comprising biasing the substrate and the coil.

27. The method of claim 24, wherein the coil is made of a material selected from a group consisting of titanium, tantalum and tungsten.

28. The method of claim 24, wherein the sputtering target is made of a material selected from a group consisting of titanium, tantalum, and tungsten.

* * * * *